(12) United States Patent
Kwon

(10) Patent No.: US 8,906,723 B1
(45) Date of Patent: Dec. 9, 2014

(54) DONOR SUBSTRATE, METHOD FOR FABRICATING THE DONOR SUBSTRATE, AND METHOD FOR FORMING TRANSFER PATTERN USING THE DONOR SUBSTRATE

(71) Applicant: Samsung Display Co., Ltd., Yongin, Gyeonggi-Do (KR)

(72) Inventor: YoungGil Kwon, Suwon-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/017,102

(22) Filed: Sep. 3, 2013

(30) Foreign Application Priority Data

May 28, 2013 (KR) .................. 10-2013-0060493

(51) Int. Cl.
*H01L 21/00* (2006.01)
*H01L 21/46* (2006.01)
*H01L 29/18* (2006.01)
*H01L 33/00* (2010.01)
*H01L 51/00* (2006.01)
*H01L 51/56* (2006.01)

(52) U.S. Cl.
CPC ............ *H01L 51/0013* (2013.01); *H01L 51/56* (2013.01); *H01L 51/0026* (2013.01); *H01L 51/0002* (2013.01)
USPC .................. 438/34; 438/458; 257/88

(58) Field of Classification Search
USPC ..................... 438/34, 458; 257/88
See application file for complete search history.

(56) References Cited

U.S. PATENT DOCUMENTS

| 6,214,520 | B1 | 4/2001 | Wolk et al. | |
|---|---|---|---|---|
| 2003/0068525 | A1 | 4/2003 | Bellmann et al. | |
| 2004/0056266 | A1* | 3/2004 | Suh et al. | 257/99 |
| 2005/0123801 | A1* | 6/2005 | Yang et al. | 428/690 |
| 2006/0046182 | A1* | 3/2006 | Song et al. | 430/199 |
| 2008/0003519 | A1 | 1/2008 | Felder et al. | |
| 2010/0276680 | A1* | 11/2010 | Kang et al. | 257/40 |

FOREIGN PATENT DOCUMENTS

| JP | 2005500652 | 1/2005 |
|---|---|---|
| KR | 1020070067725 | 6/2007 |
| WO | 03/017731 | 2/2003 |

OTHER PUBLICATIONS

Kamegawa et al., "Superhydrophobic Surfaces with Photocatalytic Self-Cleaning Properties by Nanocomposite Coating of TiO2 and Polytetrafluoroethylene". Advanced Materials, 2012, 24, pp. 3697-3700.

\* cited by examiner

*Primary Examiner* — Karen Kusumakar
(74) *Attorney, Agent, or Firm* — Innovation Counsel LLP

(57) ABSTRACT

A donor substrate may include a base layer, a light-to-heat conversion layer disposed on the base layer, a buffer layer disposed on the light-to-heat conversion layer and including a composite layer of titanium dioxide and polytetrafluoroethylene, and a transfer layer disposed on the buffer layer. The buffer layer may be disposed between the transfer layer and the light-to-heat conversion layer. The buffer layer may be cleaned by incident light to preserve or improve its hydrophobicity. Accordingly, the buffer layer can be easily separated from the transfer layer. Advantageously, when (a portion of) the transfer layer is transferred onto a target substrate, unwanted material transfer may be prevented.

11 Claims, 10 Drawing Sheets (1) (2) (3)

(1) (2) (3)

(1) (2) (3)

US 8,906,723 B1

DONOR SUBSTRATE, METHOD FOR FABRICATING THE DONOR SUBSTRATE, AND METHOD FOR FORMING TRANSFER PATTERN USING THE DONOR SUBSTRATE

CROSS-REFERENCE TO RELATED APPLICATIONS

This U.S. non-provisional patent application claims priority under 35 U.S.C. §119 to and benefit of Korean Patent Application No. 10-2013-0060493, filed on May 28, 2013, in the Korean Intellectual Property Office, the entire contents of which are incorporated herein by reference.

BACKGROUND OF THE INVENTION

The invention is related to a donor substrate, a method for fabricating the donor substrate, and a method for forming a transfer pattern using the donor substrate.

A laser induced thermal imaging (LITI) technique may be used to form a transfer patter, which may be an organic pattern or an inorganic pattern, on a transfer-target substrate. For example, the laser induced thermal imaging (LITI) technique may be used to fabricate an organic light-emitting device.

A donor substrate may be used for performing the laser induced thermal imaging (LITI) technique. The donor substrate may include a light-to-heat conversion layer for converting incident light into heat and may include a transfer layer overlapping the light-to-heat conversion layer and configured to be transferred to the transfer-target substrate for forming the transfer pattern.

In a conventional laser induced thermal imaging (LITI) process, a portion of the light-to-heat conversion layer may be attached to the transfer layer and may be undesirably transferred to the transfer-target substrate with the transfer layer.

SUMMARY

Example embodiments of the invention may be related to a donor substrate that includes a buffer layer. The hydrophobicity of the buffer layer may be preserved through a photocatalytic cleaning process.

Example embodiments of the invention may be related to a method of fabricating the donor substrate.

Example embodiments of the invention may be related to a method of forming a transfer pattern using the donor substrate.

According to example embodiments of the invention, a donor substrate may include a base layer, a light-to-heat conversion layer disposed on the base layer, a buffer layer disposed on the light-to-heat conversion layer and including a composite layer of titanium dioxide and polytetrafluoroethylene, and a transfer layer disposed on the buffer layer. The buffer layer may be disposed between the transfer layer and the light-to-heat conversion layer and may be cleaned by incident light.

In example embodiments, the donor substrate may further include an intermediate layer for preventing an optical absorption material in the light-to-heat conversion layer from diffusing into the transfer layer. The intermediate layer may be disposed between the light-to-heat conversion layer and the buffer layer.

According to example embodiments of the invention, a method for fabricating a donor substrate may include forming a light-to-heat conversion layer on a base layer, forming a buffer layer on the light-to-heat conversion layer, irradiating light onto the buffer layer, and forming a transfer layer on the buffer layer irradiated by light. The buffer layer may include a composite layer of titanium dioxide and polytetrafluoroethylene.

In example embodiments, the forming of the buffer layer may be performed in such a way that titanium dioxide and polytetrafluoroethylene may be simultaneously deposited on the light-to-heat conversion layer using a RF magnetron sputtering process.

In example embodiments, the method may further include forming an intermediate layer between the light-to-heat conversion layer and the transfer layer. The intermediate layer may be configured for preventing a photothermal conversion material in the light-to-heat conversion layer from diffusing into the transfer layer.

In example embodiments, the method may include forming the intermediate layer directly on the light-to-heat conversion layer.

In example embodiments, the intermediate layer may be formed between the light-to-heat conversion layer and the buffer layer.

According to example embodiments of the invention, a method for forming a transfer pattern may include disposing a donor substrate on a transfer-target substrate such that a transfer layer of the donor substrate may be in direct contact with the transfer-target substrate. The donor substrate may include a light-to-heat conversion layer and a buffer layer disposed between the light-to-heat conversion layer and the transfer layer. The buffer layer may include a composite layer of titanium dioxide and polytetrafluoroethylene. The method may further include irradiating light onto the donor substrate to transfer at least a portion of the transfer layer onto the transfer-target substrate for forming a transfer pattern on the transfer-target substrate. The method may further include removing a remaining portion the donor substrate from the transfer-target substrate. The transfer-target substrate may be a portion of an organic light-emitting display substrate. The transfer pattern may be a portion of an organic light-emitting device.

Figure 1:
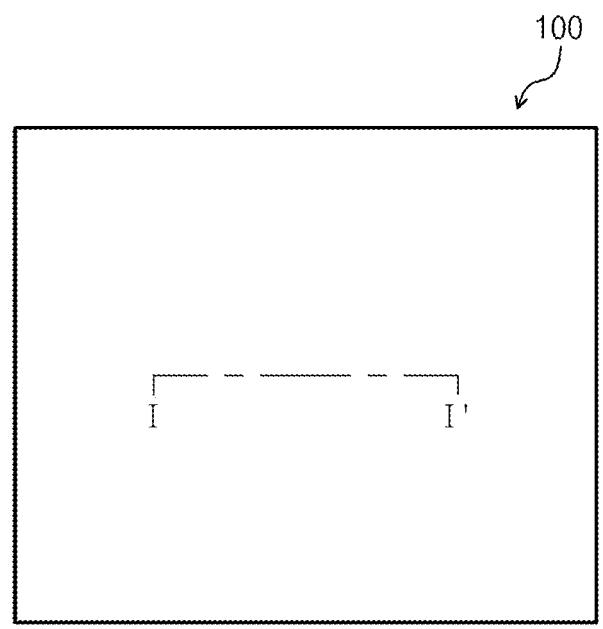
FIG. 1 is a plan view illustrating a donor substrate according to example embodiments of the invention.

It should be noted that these figures are intended to illustrate the general characteristics of methods, structure, and/or materials utilized in certain example embodiments and to supplement the written description provided below. These drawings may not be to scale and should not be interpreted as defining or limiting ranges of values or properties related to the example embodiments. For example, the relative thicknesses and positioning of molecules, layers, regions, and/or structural elements may be reduced or exaggerated for clarity. Similar or identical reference numbers in the drawings may indicate similar or identical elements or features.

DETAILED DESCRIPTION

Example embodiments of the invention will now be described more fully with reference to the accompanying drawings. The invention may be embodied in many different forms and should not be construed as being limited to the example embodiments set forth herein.

In this description, when an element is referred to as being "connected" or "coupled" to another element, it can be directly connected or coupled to the other element; alternatively, one or more intervening elements may be present. When an element is referred to as being "directly connected" or "directly coupled" to another element, there are no intended intervening elements (except possible environmental elements, e.g., air) present. Other words used to describe the relationship between elements or layers should be interpreted in a like fashion (e.g., "between" versus "directly between," "adjacent" versus "directly adjacent," and "on" versus "directly on"). When an element, such as a layer, region, or substrate is referred to as being "on" another element, it can be directly on the other element; alternatively, one or more intervening elements may be present.

Like reference numbers may indicate like elements. The term "and/or" may include any and all combinations of one or more of the listed items.

Although the terms "first", "second", etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments. The description of an element as a "first" element may not require or imply the presence of a second element or other elements. The terms first, second, etc. may also be used herein to differentiate different categories of elements. For conciseness, the terms first, second, etc. may represent first-type (or first-category), second-type (or second-category), etc., respectively.

Spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be oriented in various ways (e.g., rotated 90 degrees or disposed at other orientations) and the spatially relative descriptors may be interpreted accordingly.

The terminology used herein is for the purpose of describing particular embodiments and is not intended to be limiting of example embodiments. As used herein, the singular forms "a," "an", and "the" may include the plural forms as well, unless the context clearly indicates otherwise. The terms "comprises", "comprising", "includes", and/or "including," if used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the invention belong. Terms, such as those defined in commonly-used dictionaries, should be interpreted as having meanings that are consistent with their meanings in the context of the relevant art and should not be interpreted in an idealized or overly formal sense unless expressly so defined herein.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Figure 2:
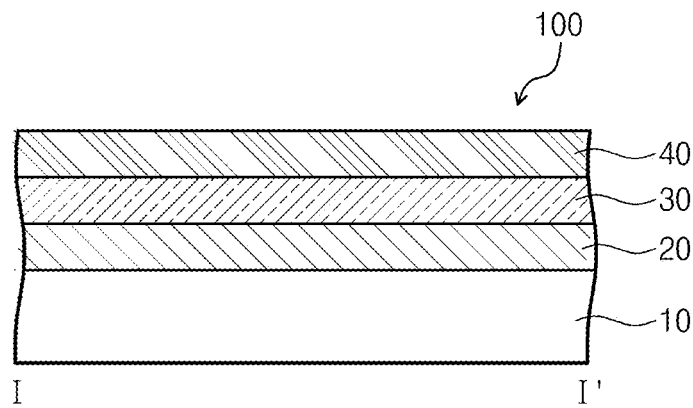
FIG. 2 is a cross-sectional view illustrating a donor substrate according to example embodiments of the invention.
Figure 3:
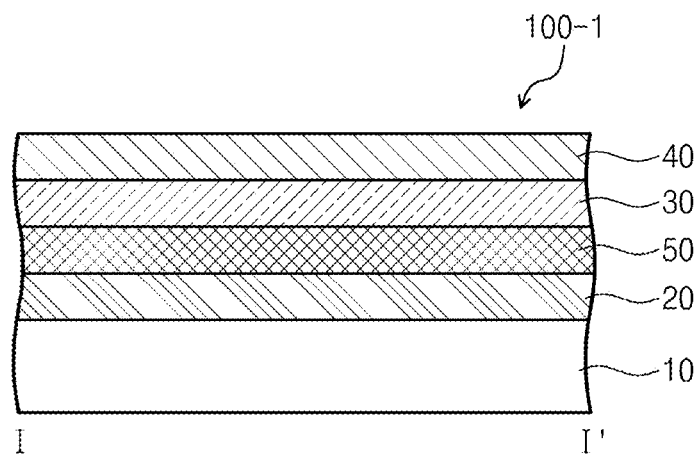
FIG. 3 is a cross-sectional view illustrating a donor substrate according to example embodiments of the invention.

FIG. 1 is a plan view illustrating a donor substrate 100 according to example embodiments of the invention. FIGS. 2 and 3 are cross-sectional views illustrating donor substrates according to example embodiments of the invention. FIG. 2 may be a cross-sectional view of the donor substrate 100 taken along a line I-I' illustrated in FIG. 1. FIG. 3 may be a cross-sectional view of a donor substrate 100-1. A plan view of the donor substrate 100-1 may be analogous to the plan view of the donor substrate 100 illustrated in FIG. 1.

As illustrated in FIGS. 1 and 2, the donor substrate 100 may include a base layer 10, a light-to-heat conversion layer 20, a buffer layer 30, and a transfer layer 40. Although not illustrated in the drawings, a functional layer may be additionally provided between the base layer 10 and the light-to-heat conversion layer 20.

The base layer 10 may be formed of a transparent material, thereby allowing incident light to penetrate therethrough. For example, the base layer 10 may include at least one polymer material, such as at least one of polyester, polyacryl, polyepoxy, polyethylene, polystyrene, and polyethyleneterephthalate. The base layer 10 may be formed of a polymer film (e.g., made of the polymer material), glass, or quartz. The base layer 10 may have a thickness that is in a range of about 10 μm to 500 μm.

The light-to-heat conversion layer 20 may be provided on the base layer 10. The light-to-heat conversion layer 20 may be configured to absorb the incident light and convert the absorbed light into heat. The light-to-heat conversion layer 20 may be configured to absorb (a portion of) the incident light with wavelengths in a specific wavelength range (e.g., infrared or visible range).

The light-to-heat conversion layer 20 may include an optical absorption material with a specific optical density. For example, the light-to-heat conversion layer 20 may include one or more metals, e.g., aluminum (Al), nickel (Ni), molybdenum (Mo), titanium (Ti), zirconium (Zr), copper (Cu), vanadium (V), tantalum (Ta), palladium (Pd), ruthenium (Ru), iridium (Ir), gold (Au), silver (Ag), platinum (Pt), one or more oxides thereof, one or more sulfides thereof, carbon black, graphite, and/or an optical absorption polymer material (e.g., infrared dye material). In example embodiments, at least one of the materials listed above may be used for forming the light-to-heat conversion layer 20. The light-to-heat conversion layer 20 may have a single-layered structure or a multi-layered structure including at least one of the materials.

The light-to-heat conversion layer 20 may include a binder. The light-to-heat conversion layer 20 may be an organic layer including carbon black dispersed in an organic binder. The light-to-heat conversion layer 20 may be a metal-containing layer (e.g., metal oxide or metal sulfide).

The buffer layer 30 may be provided on the light-to-heat conversion layer 20, with the light-to-heat conversion layer 20 being disposed between the buffer layer and the base layer 10. The buffer layer 30 may include a composite layer of titanium dioxide and polytetrafluoroethylene. The composite layer of titanium dioxide and polytetrafluoroethylene may have hydrophobicity. During the formation of the transfer pattern, the composite layer of titanium dioxide and polytetrafluoroethylene having hydrophobicity may contribute to accelerated separation between the buffer layer 30 and the transfer layer 40 and may prevent (a substantial portion of) the buffer layer 30 from being transferred along with the transfer layer 40.

The composite layer of titanium dioxide and polytetrafluoroethylene may prevent a surface of the buffer layer 30 from being substantially contaminated by pollutant. For example, the composite layer of titanium dioxide and polytetrafluoroethylene may be cleaned by incident light, such that the pollutant can be removed. In example embodiments, the buffer layer 30 may have a photocatalytic cleaning (or photocatalytic self-cleaning) property, which may allow the buffer layer 30 to maintain or regain its hydrophobicity, even if the buffer layer 30 is temporarily polluted.

The transfer layer 40 may be disposed on the buffer layer 30, with the buffer layer 30 being disposed between the transfer layer 40 and the light-to-heat conversion layer 20. The transfer layer 40 may include an organic or inorganic material, which will be transferred when the transfer layer 40 has received sufficient thermal energy. For example, the transfer layer 40 may include an organic material for forming a color filter or may include functional materials for forming an organic light-emitting device.

As illustrated in FIG. 3, according to example embodiments of the invention, the donor substrate 100-1 may further include an intermediate layer 50 in addition to the layers included for the donor substrate 100. For example, the intermediate layer 50 may be provided between the light-to-heat conversion layer 20 and the buffer layer 30. The intermediate layer 50 may prevent the transfer layer 40 from being substantially polluted by an optical absorption material (e.g., carbon black) in the light-to-heat conversion layer 20. The intermediate layer 50 may include, for example, one or more of a polymer, a metal, an inorganic material, an inorganic oxide, and a composite of organic and inorganic materials.

Figure 4:
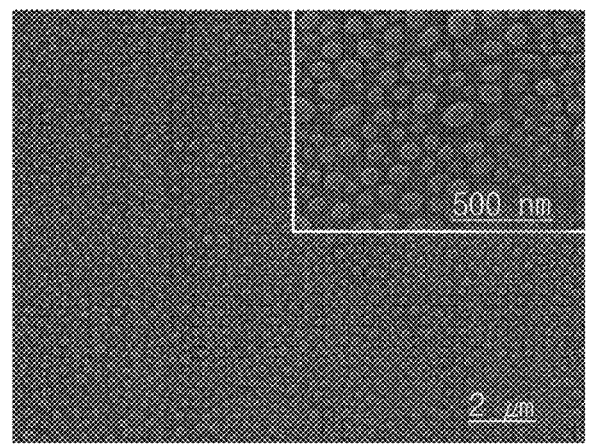
FIG. 4 is a field emission scanning electron microscope (FE-SEM) image illustrating a buffer layer according to example embodiments of the invention.
Figure 5A:
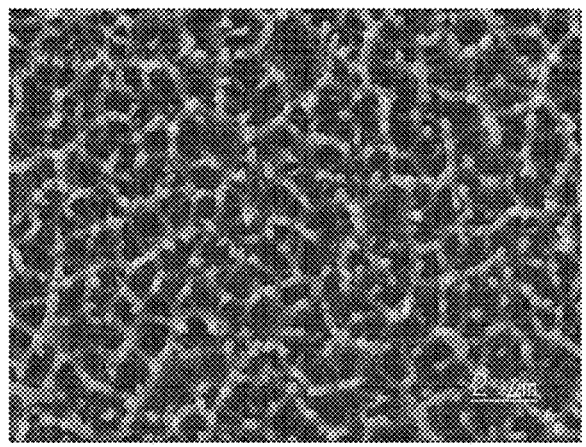
FIG. 5A is a FE-SEM image illustrating a buffer layer according to example embodiments of the invention.
Figure 5B:
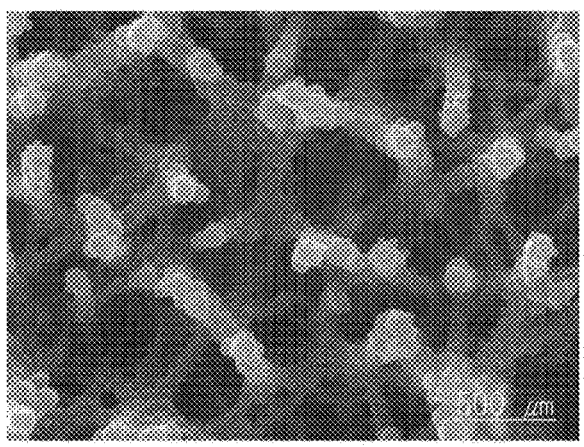
FIG. 5B is an enlarged view illustrating a portion of FIG. 5A.

FIG. 4 is a field emission scanning electron microscope (FE-SEM) image illustrating a buffer layer according to example embodiments of the invention. FIG. 5A is an FE-SEM image illustrating a buffer layer according to example embodiments of the invention, and FIG. 5B is an enlarged view illustrating a portion of FIG. 5A.

FIG. 4 shows a composite layer of titanium dioxide and polytetrafluoroethylene deposited on a quartz substrate. FIGS. 5A and 5B show a composite layer of titanium dioxide and polytetrafluoroethylene deposited on a titanium substrate. The composite layers of titanium dioxide and polytetrafluoroethylene were deposited using a radio frequency-magnetron sputtering technique.

As shown in FIG. 4, the composite layer of titanium dioxide and polytetrafluoroethylene deposited on the quartz substrate formed regularly-arranged patterns. In the composite layer of titanium dioxide and polytetrafluoroethylene illustrated in FIG. 4, a mole ratio (or molar ratio) of titanium to fluorine was 15:100.

Fluorine in the polytetrafluoroethylene may provide hydrophobicity to the composite layer of titanium dioxide and polytetrafluoroethylene. The titanium dioxide may provide the photocatalytic cleaning property to the composite layer of titanium dioxide and polytetrafluoroethylene.

As shown in FE-SEM images provided in FIGS. 5A and 5B, the composite layer of titanium dioxide and polytetrafluoroethylene formed on the titanium substrate may have a structure that includes tangled rod-shape patterns. In example embodiments, a surface of the titanium substrate may include tangled needle-shaped titanium protrusions. Each of the titanium protrusions was coated with the composite layer of titanium dioxide and polytetrafluoroethylene, and thus the composite layer of titanium dioxide and polytetrafluoroethylene was formed to have the rod-shape patterns.

The rod-shaped structure of the composite layer may include spherical patterns of titanium dioxide scattered on the protrusions of polytetrafluoroethylene. In each of the rods, island-like patterns of titanium dioxide were formed on the sea-like pattern of polytetrafluoroethylene.

Figure 6:
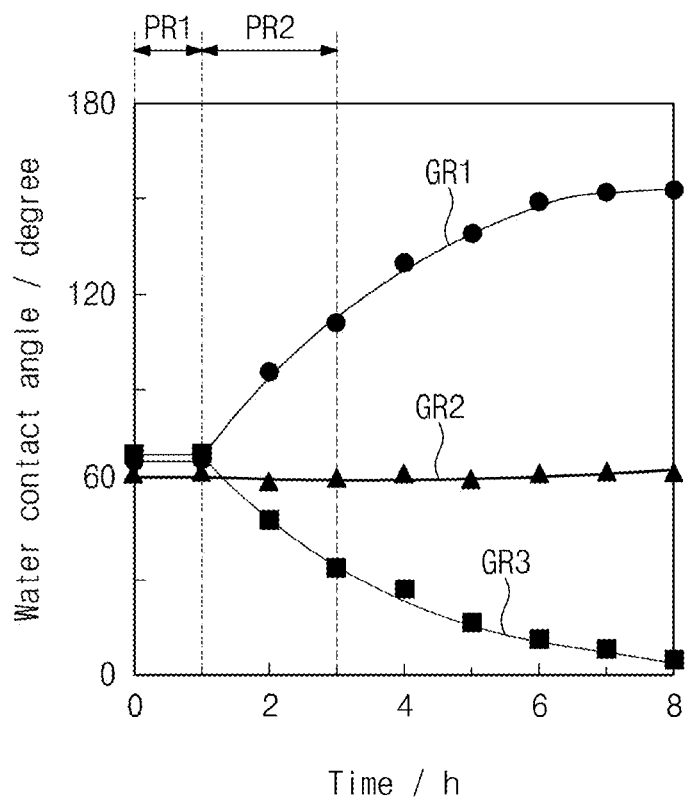
FIG. 6 is a graph illustrating a light-dependent contact angle.
Figure 7A:
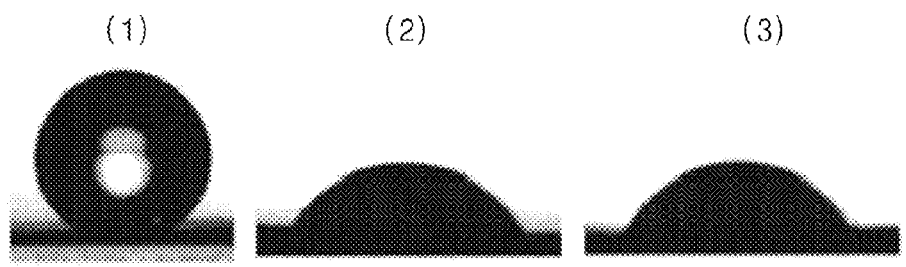
FIGS. 7A through 7C are images illustrating a change in a contact angle of a water droplet.
Figure 7B:
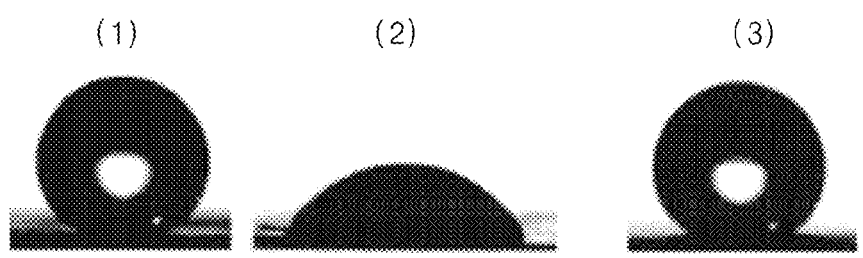
Figure 7C:
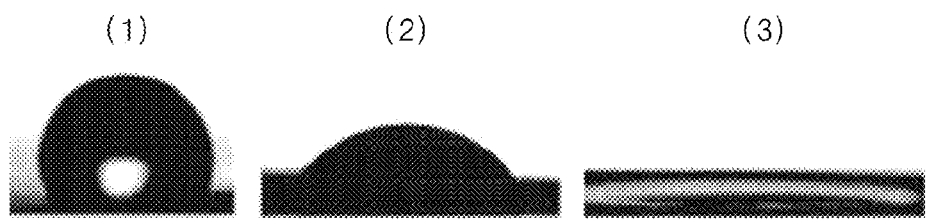

FIG. 6 is a graph illustrating a light-dependent contact angle. FIGS. 7A through 7C are images illustrating a change in contact angle of a water droplet.

In FIG. 6, a first graph GR1 illustrates change of a contact angle of the composite layer of titanium dioxide and polytetrafluoroethylene deposited on a titanium substrate, a second graph GR2 illustrates change of a contact angle of polytetrafluoroethylene deposited on a titanium substrate, and a third graph GR3 illustrates change of a contact angle of titanium dioxide deposited on a titanium substrate.

The graphs GR1, GR2, and GR3 were measured from droplets on a surface polluted by oleic acid. In the measurement, light was blocked in a first range (or first time interval) PR1 of FIG. 6 and was provided in a second range (or second time interval) PR2 illustrated in FIG. 6. For example, ultraviolet light was provided in the second range PR2.

Contact angles of the graphs GR1, GR2, and GR3 were substantially equivalent to each other in the first range PR1. When light was provided, in the second range PR2, contact angles of the graphs GR1, GR2, and GR3 showed behaviors that are substantially different from each other.

As shown in the second graph GR2, incident light did not substantially change wettability of polytetrafluoroethylene deposited on the titanium substrate. As shown in the third graph GR3, the incident light recovered hydrophilicity of the titanium dioxide deposited on the titanium substrate, resulting in a small contact angle. The oleic acid was removed using the photocatalytic cleaning property of the titanium dioxide. As shown in the first graph GR1, the incident light restored hydrophobicity of the composite layer of titanium dioxide and polytetrafluoroethylene deposited on the titanium substrate, resulting in a large contact angle. The oleic acid was removed using the photocatalytic cleaning property of the titanium dioxide, and hydrophobicity was realized by polytetrafluoroethylene.

FIGS. 7A, 7B, and 7C illustrate changes in a contact angle of water droplets corresponding to the graphs GR1, GR2, and GR3, respectively, of FIG. 6. The first images (1) of FIGS. 7A, 7B, and 7C show water droplets that were not contaminated by pollutant. The second images (2) of FIGS. 7A, 7B, and 7C show water droplets that were provided on surfaces contaminated by oleic acid. The third images (3) of FIGS. 7A, 7B, and 7C show water droplets that were provided on surfaces contaminated by oleic acid and irradiated by light. The third images (3) of FIGS. 7A, 7B, and 7C have contact angles corresponding to the graphs GR1, GR2, and GR3, respectively, in the second range PR2 of FIG. 6.

As described with reference to FIGS. 6, 7A, 7B, and 7C, even when the composite layer of titanium dioxide and polytetrafluoroethylene is contaminated by pollutant, it may be cleaned by the incident light. Advantageously, the composite layer of titanium dioxide and polytetrafluoroethylene may maintain hydrophobicity.

FIGS. 8A through 8D are cross-sectional views illustrating a process of fabricating a donor substrate, according to example embodiments of the invention. The process of FIGS. 8A through 8D may be used to fabricate the donor substrate 100 illustrated in FIG. 2.

Figure 8A:
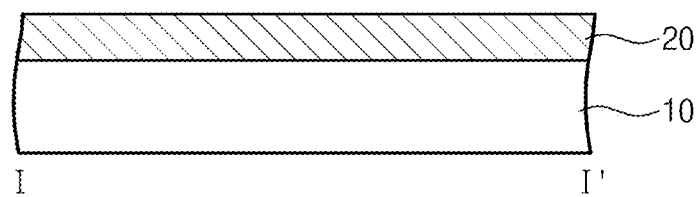
FIGS. 8A through 8D are cross-sectional views illustrating a process of fabricating a donor substrate according to example embodiments of the invention.

As shown in FIG. 8A, the light-to-heat conversion layer 20 may be formed on the base layer 10. A method of forming the light-to-heat conversion layer 20 may be selected based on the material thereof. In some embodiments, the light-to-heat conversion layer 20 is formed of metal, metal oxide, metal sulfide, carbon black, or graphite, and the light-to-heat conversion layer 20 may be formed on the base layer 10 using a vacuum deposition process, an electron-beam deposition process, and/or a sputtering process. In some embodiments, the light-to-heat conversion layer 20 is formed of polymer, and the light-to-heat conversion layer 20 may be formed using one or more of a roll coating process, an extrusion coating process, a spin coating process, and a knife coating process.

Figure 8B:
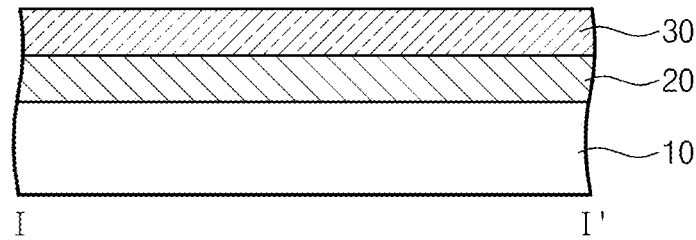

As shown in FIG. 8B, the buffer layer 30 may be formed on the light-to-heat conversion layer 20. The buffer layer 30 may include a composite layer of titanium dioxide and polytetrafluoroethylene. For example, an RF magnetron sputtering process may be used to deposit titanium dioxide and polytetrafluoroethylene at the same time on the light-to-heat conversion layer 20.

Figure 8C:
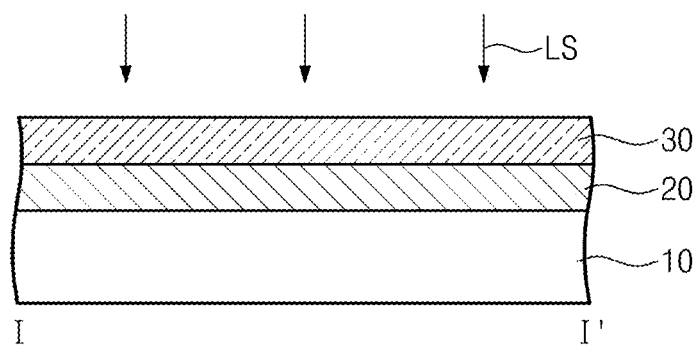

Thereafter, as shown in FIG. 8C, light LS may be irradiated onto the buffer layer 30. The light LS may be ultraviolet or visible light. As a result, buffer layer 30 may be cleaned to maintain or improve its hydrophobicity.

Figure 8D:
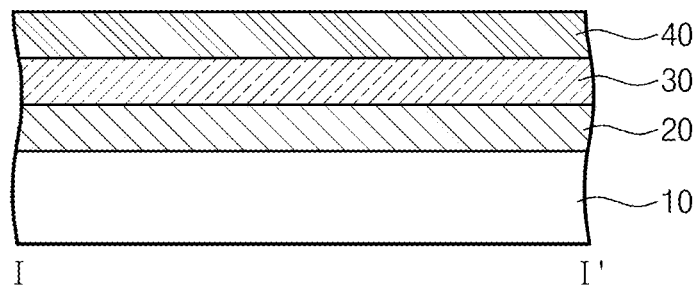

Subsequently, as shown in FIG. 8D, the transfer layer 40 may be formed on the buffer layer 30. The transfer layer 40 may be formed using a vacuum deposition process, a sputtering process, or a coating process. The transfer layer 40 may be formed on a hydrophobic surface of the buffer layer 30 that has been cleaned in the previous step.

Although not shown, the formation of the donor substrate 100-1 of FIG. 3 may further include forming the intermediate layer 50 between the formation of the light-to-heat conversion layer 20 and the formation of the buffer layer 30. The intermediate layer 50 may be formed on the light-to-heat conversion layer 20 and/or formed on the buffer layer 30 using one or more of a vacuum deposition process, a thermal deposition process, a slit coating process, and a spin coating process.

Figure 9A:
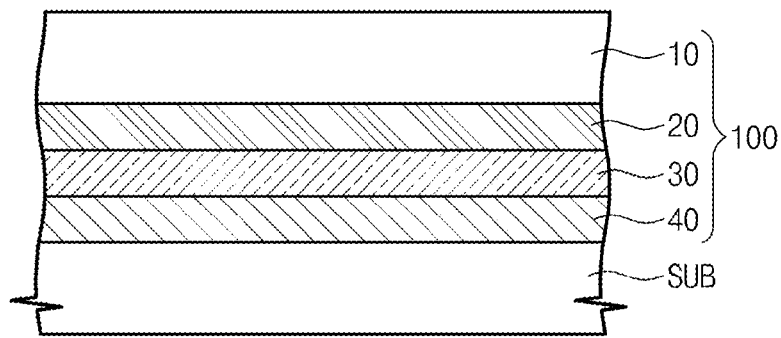
FIGS. 9A through 9C are cross-sectional views illustrating a process of forming a transfer pattern according to example embodiments of the invention.
Figure 9B:
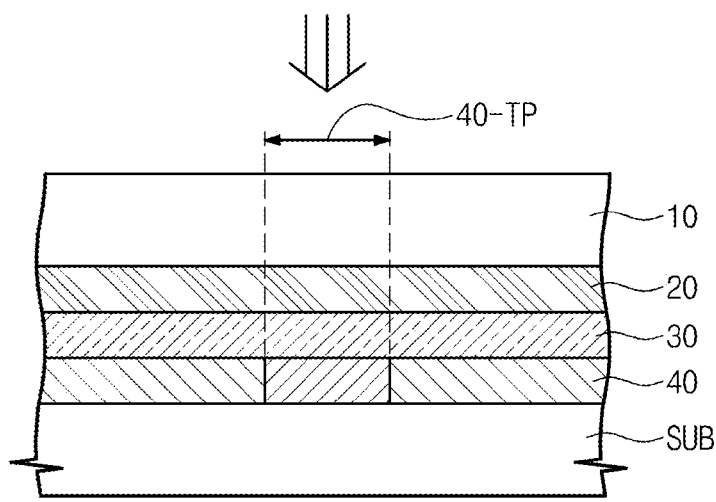
Figure 9C:
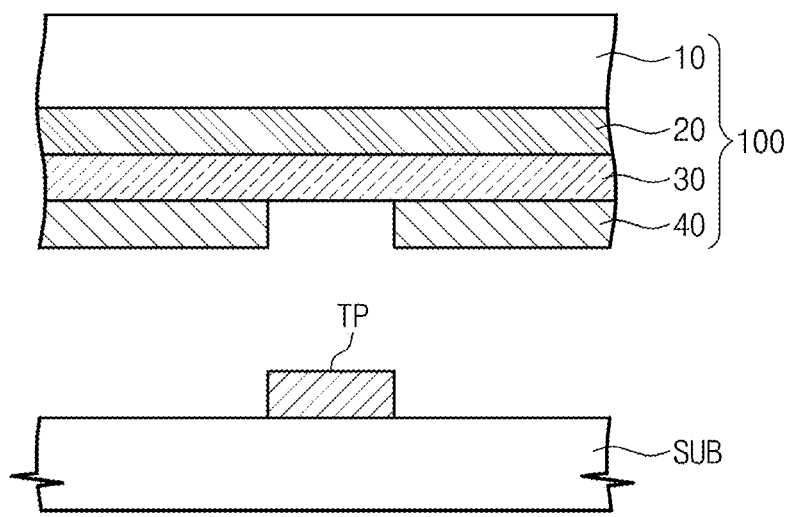

FIGS. 9A through 9C are cross-sectional views illustrating a process of forming a transfer pattern according to example embodiments of the invention. Although FIGS. 9A through 9C show how to use the donor substrate 100 illustrated in FIG. 2 to form a transfer pattern, a process analogous to the process depicted by FIGS. 9A through 9C may be used to form a transfer pattern with the donor substrate 100-1 illustrated in FIG. 3.

As shown in FIG. 9A, the donor substrate 100 may be provided on a transfer-target substrate SUB in such a way that the transfer layer 40 may be in (direct) contact with the transfer-target substrate SUB. The transfer-target substrate SUB may include an insulating layer (not shown). The insulating layer may include an organic layer and/or an inorganic layer. The transfer-target substrate SUB may be a constituent of an organic light-emitting display substrate.

As shown in FIG. 9B, light may be irradiated to the donor substrate 100. The light may be ultraviolet or visible light. In example embodiments, the light may be provided in the form of a laser beam with a specific wavelength.

To transfer a specific portion 40-TP of the transfer layer 40, light may be irradiated onto a specific portion of the donor substrate 100. This step may be performed using a facility capable of providing a localized light.

In some embodiments, this step may be performed using a light source to provide light that covers the whole region of the donor substrate 100 and using a mask to allow a fraction of the light provided from the light source to be incident to a specific portion of the donor substrate 100. In some embodiments, in order to transfer the entire transfer layer 40 onto the transfer-target substrate SUB, light may be irradiated onto the whole region of the donor substrate 100.

Consequently, as shown in FIG. 9C, a transfer pattern TP may be formed in a region on the transfer-target substrate SUB corresponding to the portion of the donor substrate 100 where the light is incident. After the formation of the transfer pattern TP, the remaining part of the donor substrate 100 may be removed from the transfer-target substrate SUB.

Figure 10:
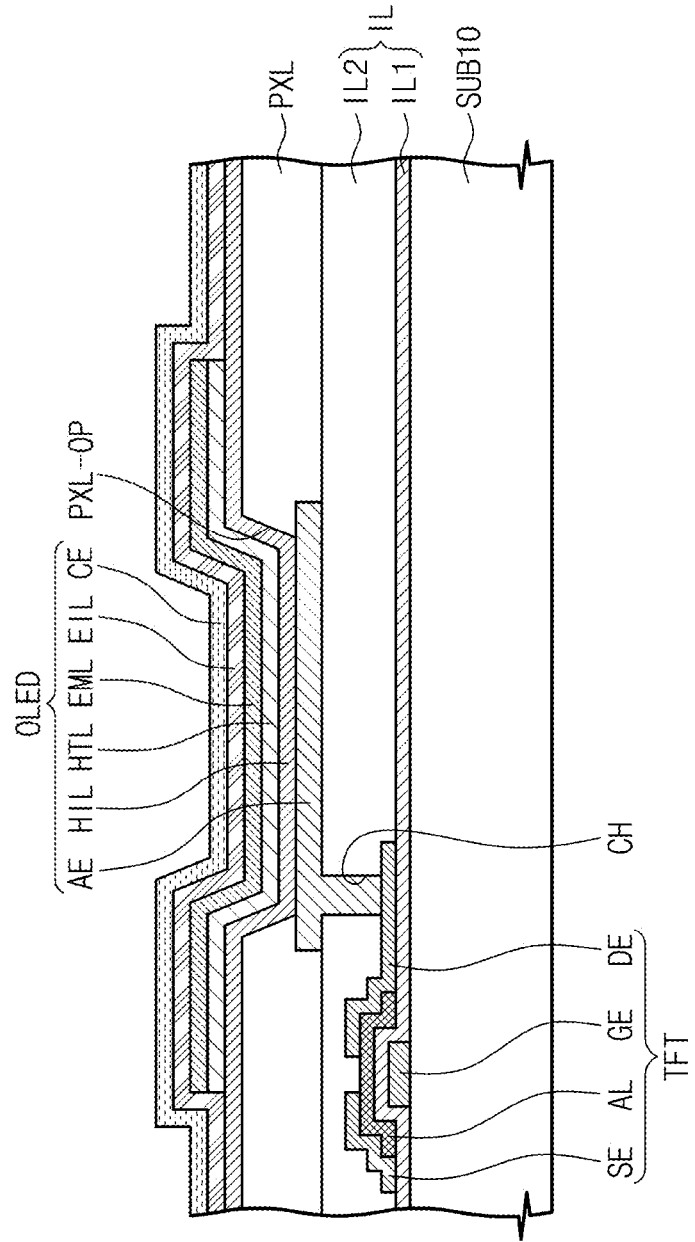
FIG. 10 is a cross-sectional view illustrating an organic light-emitting display substrate with a transfer pattern according to example embodiments of the invention.

FIG. 10 is a cross-sectional view illustrating an organic light-emitting display substrate with a transfer pattern according to example embodiments of the invention. The organic light-emitting display substrate may include a base substrate SUB10, a thin-film transistor TFT, insulating layers IL, and an organic light-emitting device OLED provided on the base substrate SUB10. A thin-film transistor TFT and an organic light-emitting device OLED may be provided on each of a plurality of pixels of the organic light-emitting display substrate. The pixels may be provided on the base substrate SUB10 to in a matrix (or array) arrangement. Although not shown, the organic light-emitting display substrate may further include a plurality of wires for providing electrical signals in the corresponding pixel.

As shown in FIG. 10, a control electrode GE of the thin-film transistor TFT may be provided on the base substrate SUB10. The base substrate SUB10 may correspond to the transfer-target substrate SUB described with reference to FIGS. 9A through 9C.

A first insulating layer IL1 may be provided on the base substrate SUB10 to cover the control electrode GE. A semiconductor layer AL may be provided on the first insulating layer IL1. An input electrode SE and an output electrode DE may be provided on the first insulating layer IL1 and may overlap the semiconductor layer AL.

A second insulating layer IL2 may be provided to cover the input electrode SE and the output electrode DE. An organic light-emitting device OLED may be provided on the second insulating layer IL2. The organic light-emitting device OLED may include a first electrode AE, a hole injection layer HIL, a hole transport layer HTL, an organic light-emitting layer EML, an electron injection layer EIL, and a second electrode CE that are sequentially stacked on the second insulating layer IL2. A portion of the organic light-emitting device OLED may be disposed in an opening PXL-OP that is formed through an insulating layer PXL that is disposed on the second insulting layer IL2. The first electrode AE may be connected to the output electrode DE through a contact hole CH penetrating the second insulating layer IL2.

Example embodiments of the invention may not be limited to a specific structure of the organic light-emitting device OLED. In some embodiments, the electron injection layer EIL may be omitted. In some embodiments, the organic light-emitting device OLED may further include an electron transport layer provided between the organic light-emitting layer EML and the electron injection layer EIL.

In some embodiments, the hole injection layer HIL and the electron injection layer EIL may be shared by the plurality of pixels and may overlap substantially the entire region of the substrate SUB10. The hole injection layer HIL and the electron injection layer EIL may be a transfer pattern TP formed on the SUB10 by applying whole-region lighting on a donor substrate 100. In some embodiments, a hole transport layer HTL and an organic light-emitting layer EML may be separately provided on each of the pixels and may overlap only specific portions of the substrate SUB10. The hole transport layer HTL and the organic light-emitting layer EML may be formed by applying local lighting on a donor substrate 100 as described with reference to FIGS. 9A through 9C.

According to example embodiments of the invention, the buffer layer may be cleaned by incident light to preserve or improve its hydrophobicity. Even if the buffer layer is contaminated by pollutant and has hydrophilicity, it can be cleaned by the incident light, and the pollutant can be removed. Accordingly, the buffer layer can be easily separated from the transfer layer. Advantageously, unwanted material transfer may be substantially prevented, and manufacturing yield may be maximized.

While example embodiments of the invention have been particularly shown and described, it will be understood by one of ordinary skill in the art that variations in form and detail may be made therein without departing from the spirit and scope of the attached claims.

What is claimed is:

1. A donor substrate comprising:
a base layer;
a light-to-heat conversion layer disposed on the base layer;
a buffer layer disposed on the light-to-heat conversion layer and including a composite layer of titanium dioxide and polytetrafluoroethylene; and
a transfer layer disposed on the buffer layer, wherein the buffer layer is disposed between the transfer layer and the light-to-heat conversion layer.

2. The donor substrate of claim 1, further comprising an intermediate layer disposed between the light-to-heat conversion layer and the buffer layer and configured to prevent an optical absorption material in the light-to-heat conversion layer from diffusing into the transfer layer.

3. A method for fabricating a donor substrate, the method comprising:
forming a light-to-heat conversion layer on a base layer;
forming a buffer layer on the light-to-heat conversion layer, the buffer layer including a composite layer of titanium dioxide and polytetrafluoroethylene;
irradiating light onto the buffer layer; and
after the irradiating, forming a transfer layer on the buffer layer.

4. The method of claim 3, wherein the forming of the buffer layer includes simultaneously depositing titanium dioxide and polytetrafluoroethylene on the light-to-heat conversion layer using a RF magnetron sputtering process.

5. The method of claim 3, further comprising forming an intermediate layer between the light-to-heat conversion layer and the transfer layer, the intermediate layer being configured to prevent a photothermal conversion material in the light-to-heat conversion layer from diffusing into the transfer layer.

6. The method of claim 5, further comprising forming the intermediate layer directly on the light-to-heat conversion layer.

7. The method of claim 5, wherein the intermediate layer is formed between the light-to-heat conversion layer and the buffer layer.

8. A method for forming a transfer pattern, the method comprising:
disposing a donor substrate on a transfer-target substrate such that a transfer layer of the donor substrate contacts the transfer-target substrate, the donor substrate including a light-to-heat conversion layer and a buffer layer disposed between the light-to-heat conversion layer and the transfer layer, the buffer layer including a composite layer of titanium dioxide and polytetrafluoroethylene;
irradiating light onto the donor substrate to transfer at least a portion of the transfer layer onto the transfer-target substrate for forming a transfer pattern on the transfer-target substrate; and
removing a remaining portion the donor substrate from the transfer-target substrate.

9. The method of claim 8, wherein the transfer-target substrate is a portion of an organic light-emitting display substrate.

10. The method of claim 8, wherein the transfer pattern is a portion of an organic light-emitting device.

11. The method of claim 8, wherein the transfer pattern comprises at least one of a light-emitting layer, a hole injection layer, a hole transport layer, an electron transport layer, and an electron injection layer of an organic light-emitting device.

* * * * *